US012787206B2

(12) United States Patent
Yao et al.

(10) Patent No.: US 12,787,206 B2
(45) Date of Patent: Nov. 3, 2026

(54) SLIDE RAIL SYSTEM FOR A SERVER RACK

(71) Applicant: FOSITEK CORPORATION, New Taipei City (TW)

(72) Inventors: Hsu-Hong Yao, New Taipei City (TW); Hsuan-Po Huang, New Taipei City (TW); Hao-Ping Wang, New Taipei City (TW)

(73) Assignee: FOSITEK CORPORATION, New Taipei City (TW)

( * ) Notice: Subject to any disclaimer, the term of this patent is extended or adjusted under 35 U.S.C. 154(b) by 179 days.

(21) Appl. No.: 18/956,162

(22) Filed: Nov. 22, 2024

(65) Prior Publication Data

US 2026/0096046 A1 Apr. 2, 2026

(30) Foreign Application Priority Data

Sep. 27, 2024 (TW) ................................ 113137103

(51) Int. Cl.
*H05K 7/00* (2006.01)
*H05K 7/14* (2006.01)

(52) U.S. Cl.
CPC .................................. *H05K 7/1489* (2013.01)

(58) Field of Classification Search
CPC .. H05K 7/1411; H05K 7/1489; H05K 7/1421; H05K 7/183; A47B 2210/0018; A47B 2210/007; A47B 2210/0081; A47B 2210/0016; A47B 2210/0064; A47B 2210/0067; A47B 2210/0059; A47B 88/49; A47B 88/44; A47B 88/447; A47B 88/423; A47B 88/90; A47B 88/40; A47B 88/70; A47B 88/02; A47B 88/407; A47B 88/0407; A47B 88/443; A47B 2088/4235; A47B 2088/0444
(Continued)

(56) References Cited

U.S. PATENT DOCUMENTS 2,250,895 A * 7/1941 Premo .................... A47B 88/57
312/334.11
4,025,138 A * 5/1977 Kittle .................. A47B 88/493
384/18
(Continued)

FOREIGN PATENT DOCUMENTS

CN 110313733 A * 10/2019 ........... A47B 88/447
CN 111839038 A * 10/2020 ............. A47B 88/90
(Continued)

*Primary Examiner* — Janet M Wilkens
(74) *Attorney, Agent, or Firm* — Birch, Stewart, Kolasch & Birch, LLP

(57) ABSTRACT

A slide rail system includes a first rail module and a second rail module. The first rail module includes a first support plate having a lock hole, and a first rail device disposed on the first support plate. The second rail module includes a second support plate movably disposed on the first support plate, a second rail device disposed on the second support plate, a latch member movably disposed on the second support plate and insertable into the lock hole to restrict movement of the second support plate relative to the first support plate, and an unlatch member operable to disengage the latch member from the lock hole so as to allow the movement of the second support plate relative to the first support plate.

9 Claims, 19 Drawing Sheets

(58) Field of Classification Search
USPC ............... 211/162, 26, 26.1; 312/330.1, 333, 312/334.44, 334.46, 223.1, 332.1, 334.7, 312/334.8, 350; 384/21
See application file for complete search history.

(56) References Cited

U.S. PATENT DOCUMENTS

| | | | | | |
|---|---|---|---|---|---|
| 4,067,632 | A * | 1/1978 | Sekerich | A47B 88/493 | 312/334.9 |
| 4,662,761 | A * | 5/1987 | Hoffman | A47B 88/493 | 384/49 |
| 4,988,214 | A * | 1/1991 | Clement | A47B 88/493 | 312/333 |
| 8,845,042 | B2 * | 9/2014 | Yang | G06F 1/187 | 312/348.6 |
| 10,376,054 | B1 * | 8/2019 | Chen | A47B 88/50 | |
| 2004/0227441 | A1 * | 11/2004 | Wang | A47B 88/49 | 312/334.8 |
| 2009/0310894 | A1 * | 12/2009 | Yu | A47B 88/44 | 384/21 |
| 2024/0237821 | A1 * | 7/2024 | Chen | A47B 88/49 | |
| 2025/0009127 | A1 * | 1/2025 | Chen | A47B 88/43 | |
| 2026/0096050 | A1 * | 4/2026 | Yao | H05K 7/1489 | |

FOREIGN PATENT DOCUMENTS

| | | | | |
|---|---|---|---|---|
| CN | 110313732 B | * | 4/2021 | A47B 88/423 |
| CN | 121586210 A | * | 2/2026 | H05K 7/1489 |
| EP | 4401519 A1 | * | 7/2024 | A47B 88/447 |
| EP | 4401521 A1 | * | 7/2024 | H05K 7/183 |
| TW | M678641 | * | 12/2025 | |
| TW | M680071 | * | 2/2026 | |

* cited by examiner

SLIDE RAIL SYSTEM FOR A SERVER RACK

CROSS-REFERENCE TO RELATED APPLICATION

This application claims priority to Taiwanese Patent Application No. 113137103, filed on Sep. 27, 2024, and incorporated by reference herein in its entirety.

FIELD

The disclosure relates to a slide rail system, and more particularly to a slide rail system for a server rack.

BACKGROUND

A conventional slide rail system for a server rack includes a first rail module and a second rail module movably disposed on the first rail module. During an installation process for mounting a server rack to the first rail module, the second rail module may be undesirably moved relative to the first rail module, which may hit the user and cause danger during the installation process.

SUMMARY

Therefore, an object of the disclosure is to provide a slide rail system that can alleviate at least one of the drawbacks of the prior art.

According to the disclosure, the slide rail system includes a first rail module and a second rail module. The first rail module includes a first support plate and a first rail device disposed on the first support plate. The first support plate has a first lock hole. The second rail module includes a second support plate movably disposed on the first support plate, a second rail device disposed on the second support plate, a latch member movably disposed on the second support plate and insertable into the first lock hole to restrict movement of the second support plate relative to the first support plate, and an unlatch member movably disposed on the second support plate. The unlatch member is operable to bring movement of the latch member relative to the second support plate to disengage the latch member from the first lock hole so as to allow the movement of the second support plate relative to the first support plate.

BRIEF DESCRIPTION OF THE DRAWINGS

Other features and advantages of the disclosure will become apparent in the following detailed description of the embodiment with reference to the accompanying drawings. It is noted that various features may not be drawn to scale.

DETAILED DESCRIPTION

Figure 1:
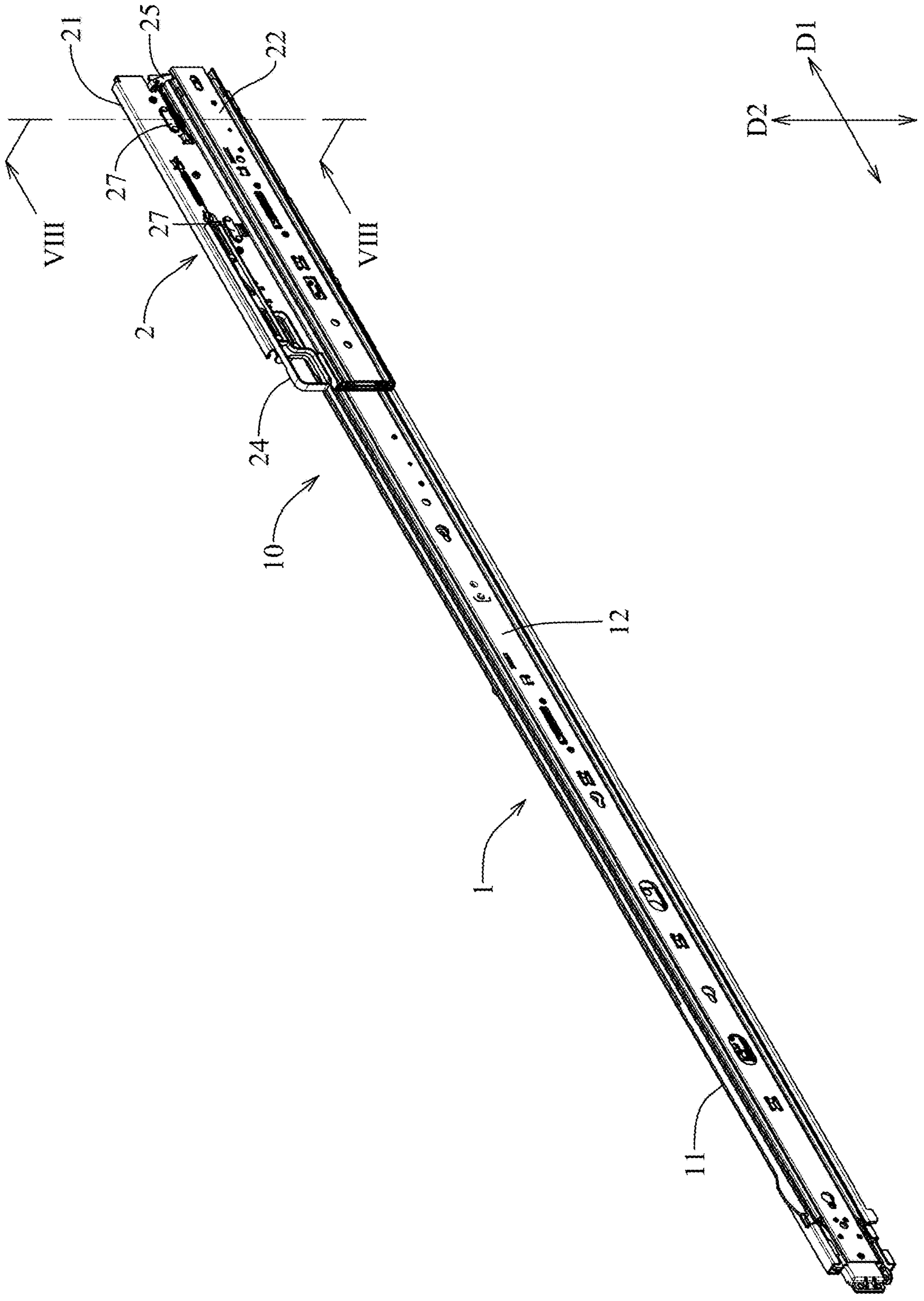
FIG. 1 is a perspective view illustrating an embodiment of a slide rail system according to the disclosure.

It should be noted herein that for clarity of description, spatially relative terms such as “top,” “bottom,” “upper,” “lower,” “on,” “above,” “over,” “downwardly,” “upwardly” and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
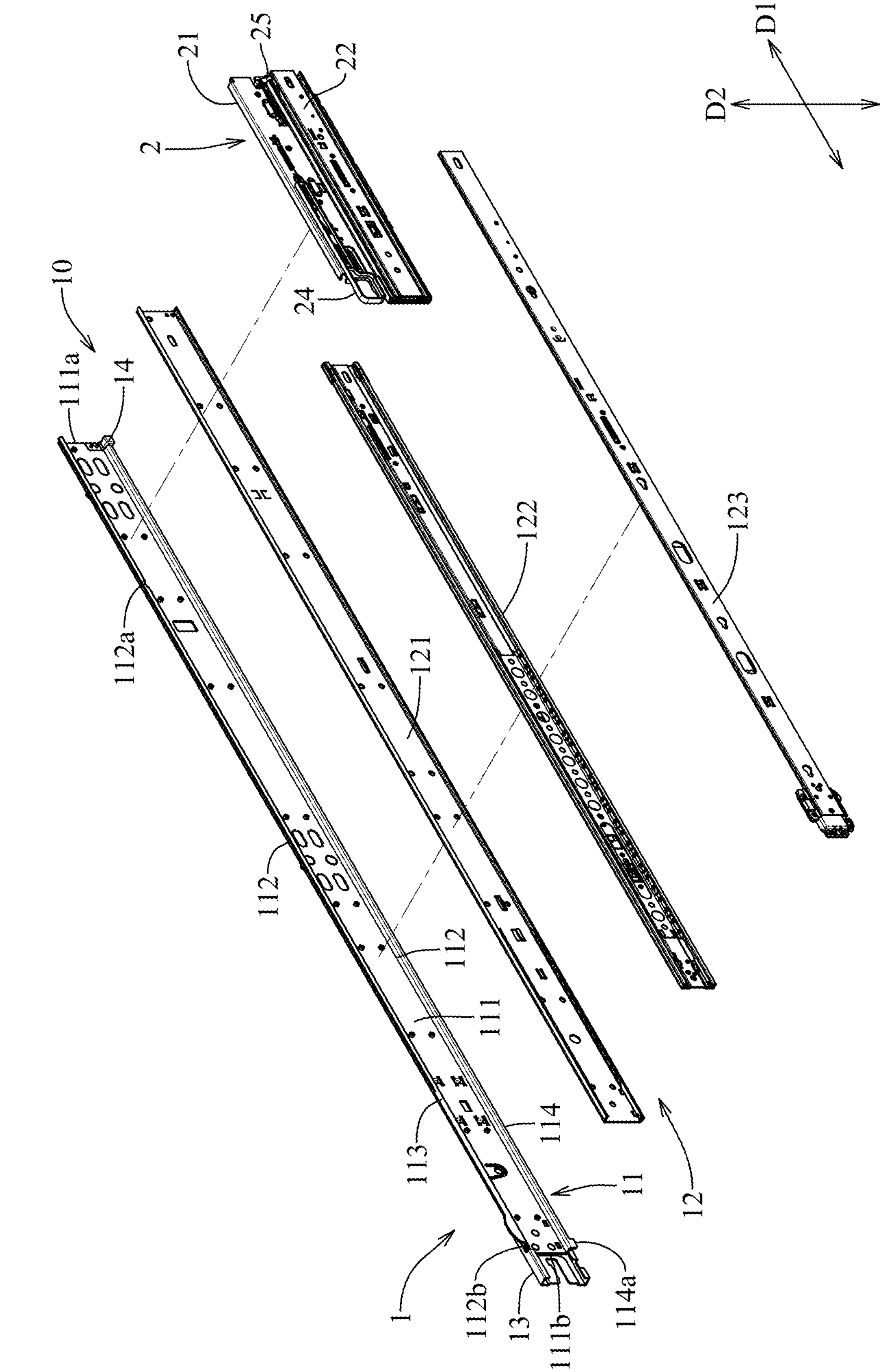
FIG. 2 is an exploded perspective view of the embodiment.

Referring to FIGS. 1 and 2, an embodiment of a slide rail system for a server rack according to the disclosure includes a first rail module 1 and a second rail module 2 movably disposed on the first rail module 1.

Figure 3:
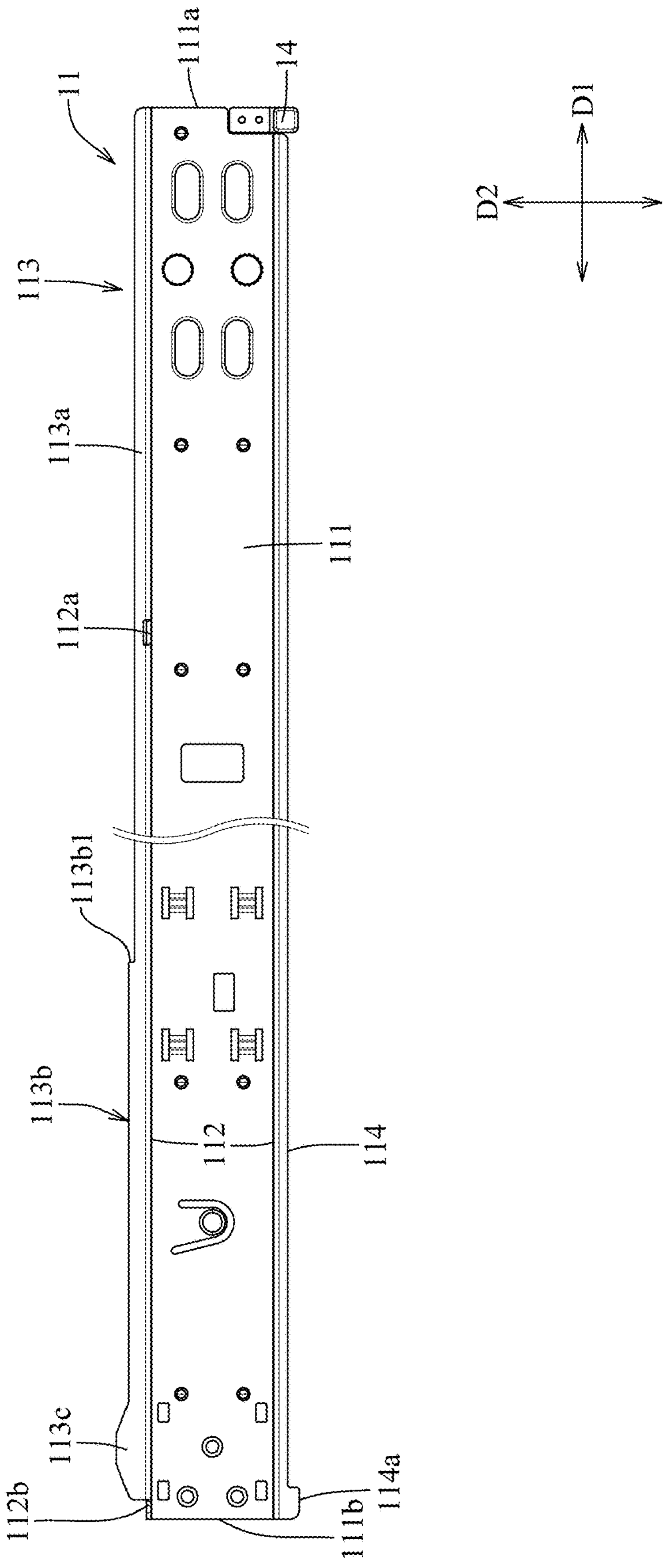
FIG. 3 is a fragmentary front view of a first support plate of a first rail module of the embodiment.
Figure 4:
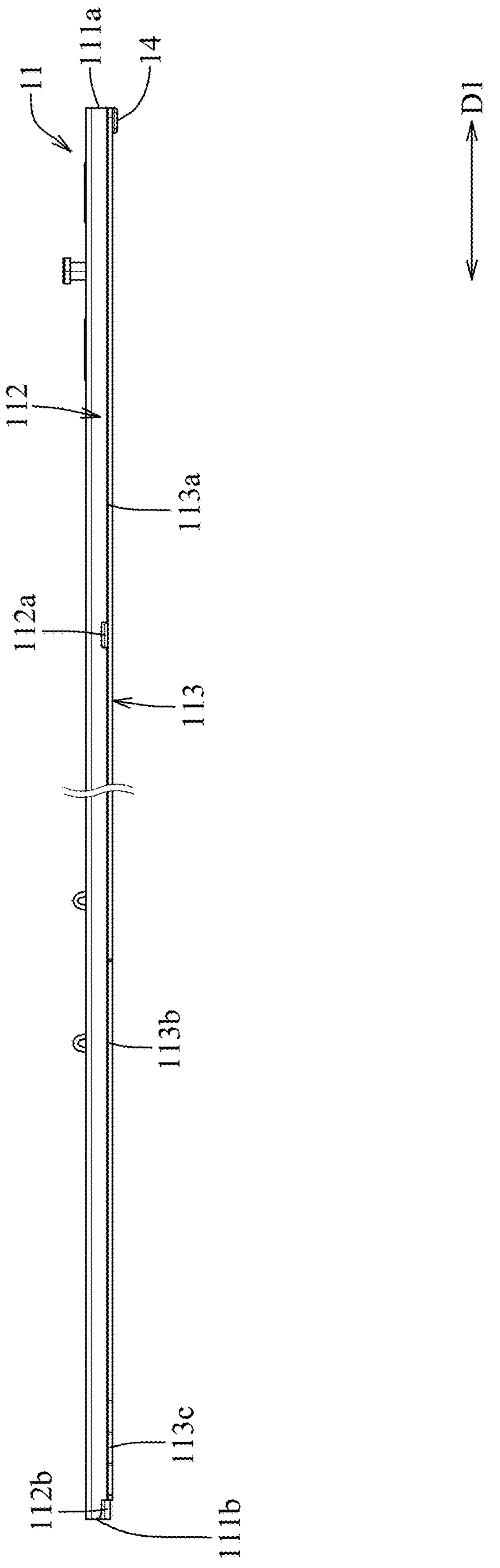
FIG. 4 is a fragmentary top view of the first support plate.

With reference to FIGS. 2 to 4, the first rail module 1 includes a first support plate 11 extending along a horizontal direction (D1), a first rail device 12 disposed on the first support plate 11, a bracket 13 disposed on the first support plate 11, and a stop member 14 disposed on the first support plate 11. The first support plate 11 has a base wall 111, upper and lower lateral walls 112 respectively formed on upper and lower sides of the base wall 111, an upper extension wall 113 extending upwardly from the upper lateral wall 112, and a lower extension wall 114 extending downwardly from the lower lateral wall 112. The base wall 111 has a first end 111*a* and a second end 111*b* opposite to the first end 111*a* in the horizontal direction (D1). The upper lateral wall 112 has a first lock hole 112*a* and a second lock hole 112*b* spaced apart from the first lock hole 112*a* and adjacent to the second end 111*b*. The upper extension wall 113 has a sliding portion 113*a* extending from the first end 111*a* toward the second end 111*b*, a raised portion 113*b* extending from and connected with the sliding portion 113*a* and having a height which is measured in an up-down direction (D2) and which is larger than that of the sliding portion 113*a* to define an abutting face 113*b*1 therebetween, and a higher portion 113*c* formed on an end of the raised portion 113*b* adjacent to the second end 111*b*. Specifically, the second lock hole 112*b* is formed between the second end 111*b* and the higher portion 113*c*. The lower extension wall 114 has a stop portion 114*a* at the second end 111*b* and protruding downwardly. The first rail device 12 has a first outer rail 121 securely disposed on the first support plate 11, a first middle rail 122 telescopically disposed on the first outer rail 121, and a first inner rail 123 telescopically disposed on the first middle rail 122. The bracket 13 is disposed on the second end 111*b* of the first support plate 11. The stop member 14 is disposed on the first end 111*a* for preventing removal of the second rail module 2 from the first rail module 1.

Figure 5:
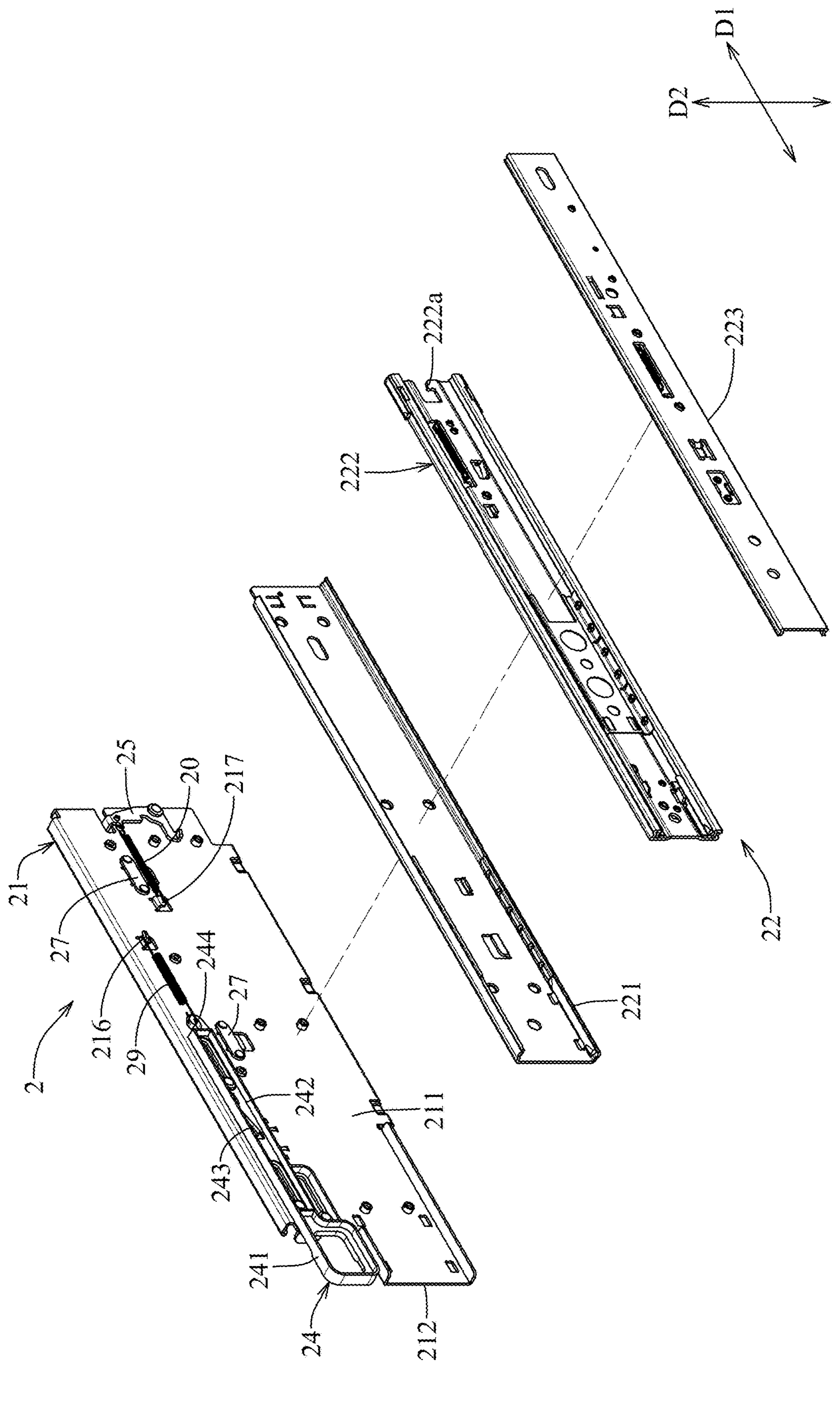
FIG. 5 is an exploded perspective view of a second rail module of the embodiment.
Figure 6:
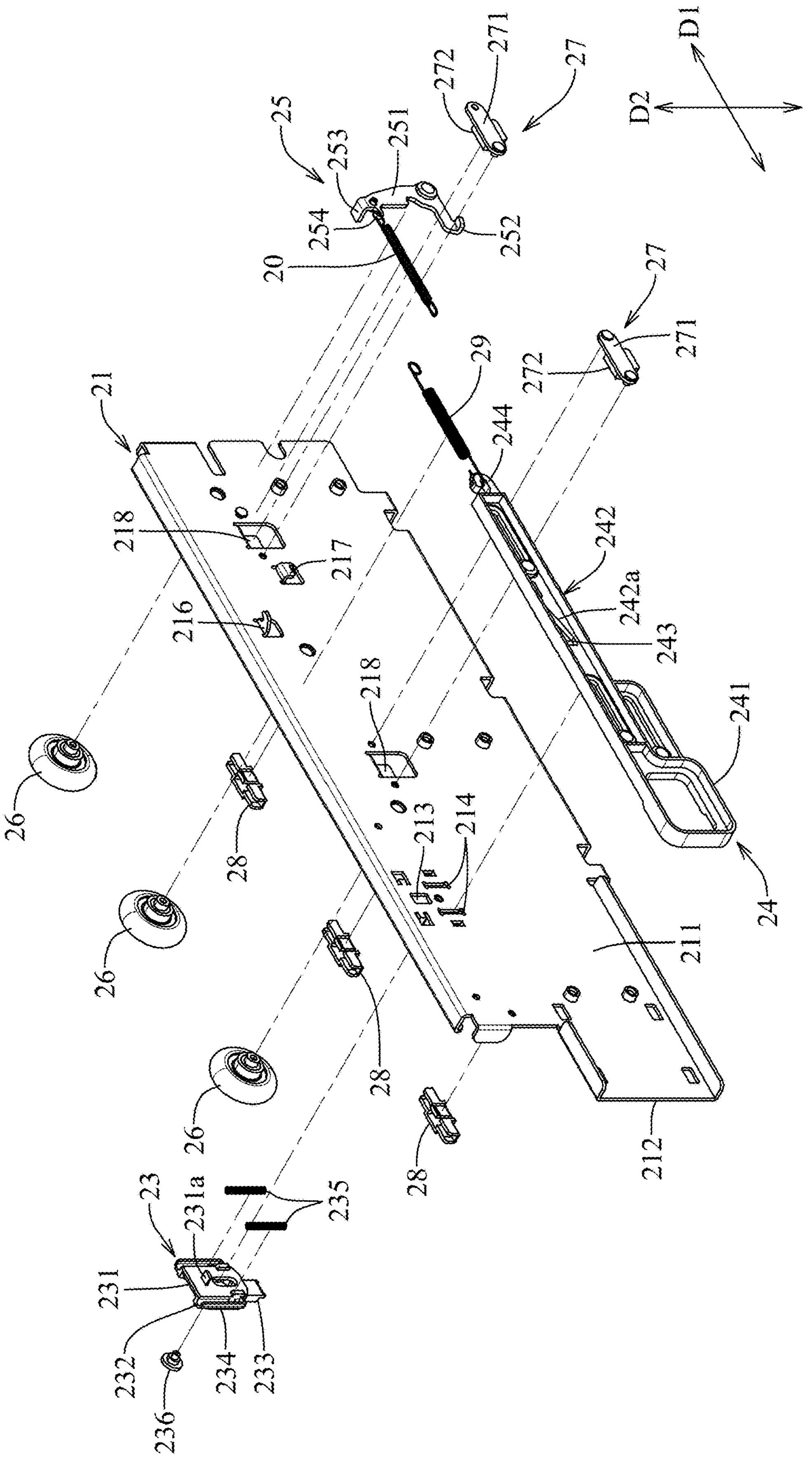
FIG. 6 is an exploded perspective view of a portion of the second rail module.
Figure 7:
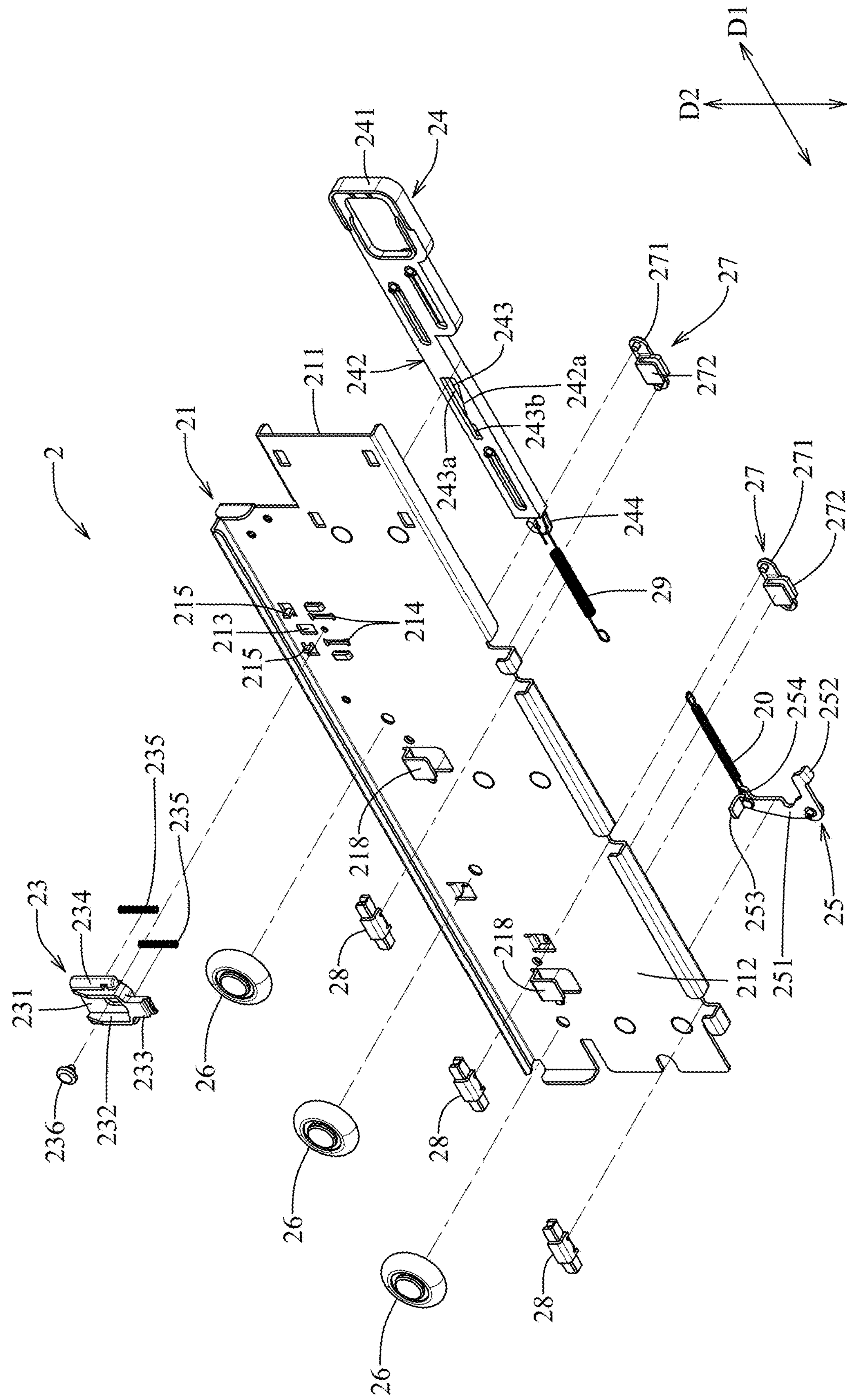
FIG. 7 is an exploded perspective view of the portion of the second rail module, taken from another angle.

With reference to FIGS. 5 to 7, the second rail module 2 includes a second support plate 21 movably disposed on the first support plate 11, a second rail device 22 disposed on the second support plate 21, a latch member 23 movably disposed on the second support plate 21 and insertable into the first lock hole 112*a* to restrict movement of the second support plate 21 relative to the first support plate 11, an unlatch member 24 movably disposed on the second support plate 21, a releasably retaining member 25 disposed on the second support plate 21, three slidable members 26 disposed on the second support plate 21 and spaced apart from one another, two upper guiding members 27 disposed on the second support plate 21, three lower guiding members 28 disposed on the second support plate 21, a first biasing member 29 disposed on the second support plate 21, and a second biasing member 20 disposed on the second support plate 21. The second support plate 21 has a first plate surface 211 on which the second rail device 22 is disposed, a second plate surface 212 opposite to the first plate surface 211, a moving slot 213 extending in the up-down direction (D2), two mounting slots 214 formed at two sides of the moving slot 213 and extending in the up-down direction (D2), two protuberances 215 formed on the second plate surface 212, a first spring hook 216 formed on the first plate surface 211, a second spring hook 217 formed on the first plate surface 211, and two L-shaped abutted plates 218 formed on the second plate surface 212. The stop portion 114*a* is disposed to stop the movement of the second support plate 21 so as to prevent removal of the second support plate 21 at the second end 111*b* from the first support plate 11.

The second rail device 22 has a second outer rail 221 which is disposed on the first plate surface 211, a second middle rail 222 which is telescopically disposed on the second outer rail 221, and a second inner rail 223 which is telescopically disposed on the second middle rail 222. The second middle rail 222 has a middle hook portion 222*a*.

With reference to FIG. 6 and FIGS. 8 to 10, the latch member 23 is movably disposed on the second support plate 21 by means of a fastener 236, and includes a flat wall portion 231 which is movably disposed on the second plate surface 212, a U-shaped surrounding wall portion 232 which is formed on the flat wall portion 231 and extends away from the second plate surface 212, a latch portion 233 which is formed on the surrounding wall portion 232 and is insertable into the first lock hole 112*a*, two tubular portions 234 which are formed at two sides of the surrounding wall portion 232, a driven protrusion 231*a* which is formed on the flat wall portion 231 and extends through the moving slot 213 to be in abutting engagement with the unlatch member 24, and two guided protrusions 231*b* which are respectively engaged in the mounting slots 214. The latch portion 233 has an abutting section 233*a* which is disposed above the upper lateral wall 112 to abut against the upper lateral wall 112, and a latch section 233*b* which extends downwardly from the abutting section 233*a* to be inserted into the first lock hole 112*a*. Each tubular portion 234 has an accommodation slot 234*a* for the corresponding protuberance 215 to be inserted therein from an upper end and for accommodating an upright biasing member 235. Specifically, each upright biasing member 235 has two ends in abutting engagement with the corresponding protuberance 215 and a bottom wall 234*b* of the tubular portion 234.

With reference to FIGS. 5 to 7 and FIG. 11, the unlatch member 24 has a loop-shaped operating portion 241, a moving portion 242 connected with the operating portion 241 and movably disposed on the first plate surface 211 in the horizontal direction (D1), an unlatch slot 243 formed through the moving portion 242, and a spring holding portion 244 connected with the moving portion 242. The driven protrusion 231*a* extends through the unlatch slot 243 to be in abutting engagement with the moving portion 242. Specifically, the unlatch slot 243 has an inclined section 243*a* and an unlatching section 243*b* in communication with the inclined section 243*a*. The inclined section 243*a* has a width which is measured in the up-down direction (D2) and is gradually decreased toward the unlatching section 243*b*. The unlatching section 243*b* has a width which is measured in the up-down direction (D2) and is larger than the width of an adjacent end of the inclined section 243*a* that is adjacent to the unlatching section 243*b*. The moving portion 242 has an inclined surface 242*a* which borders the inclined section 243*a*, and a retaining surface 242*b* which is formed between the inclined section 243*a* and the unlatching section 243*b*. The first biasing member 29 is connected between the spring holding portion 244 and the first spring hook 216.

With reference to FIGS. 5 to 7, the releasably retaining member 25 has an L-shaped pivot portion 251 which is pivotably connected with the first plate surface 211 of the second support plate 21 and has two ends angularly spaced apart from each other, a retaining portion 252 which extends from the end of the pivot portion 251 away from the second support plate 21, an abutted portion 253 which extends from and bends to the other end of the pivot portion 251 and through the second support plate 21, and a spring holding portion 254 which is formed on the pivot portion 251 adjacent to the abutted portion 253. The retaining portion 252 is engageable with the middle hook portion 222*a*. The second biasing member 20 is connected between the spring holding portion 254 and the second spring hook 217.

Figure 8:
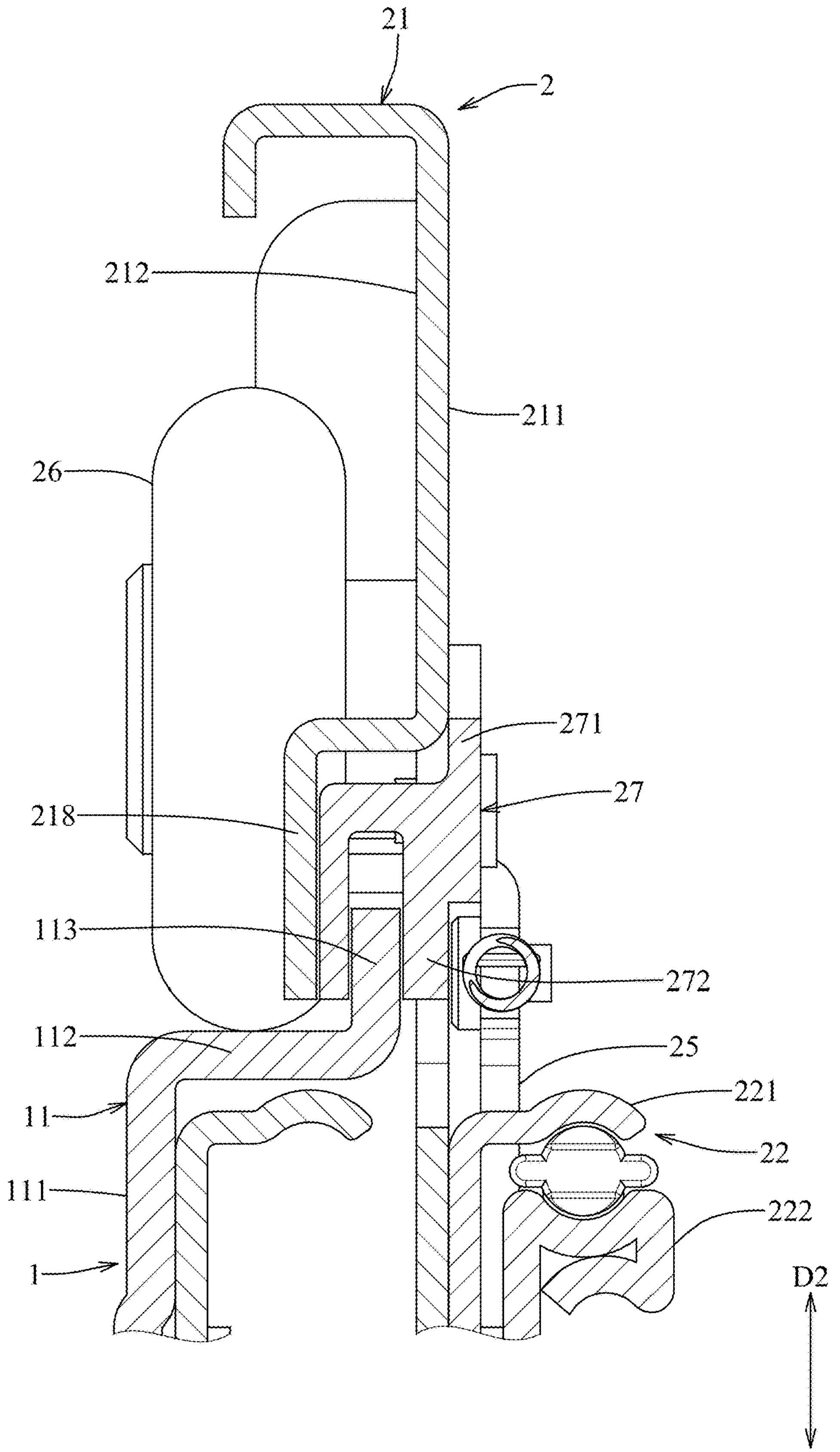
FIG. 8 is a fragmentary sectional view taken along line VIII-VIII of FIG. 1.
Figure 9:
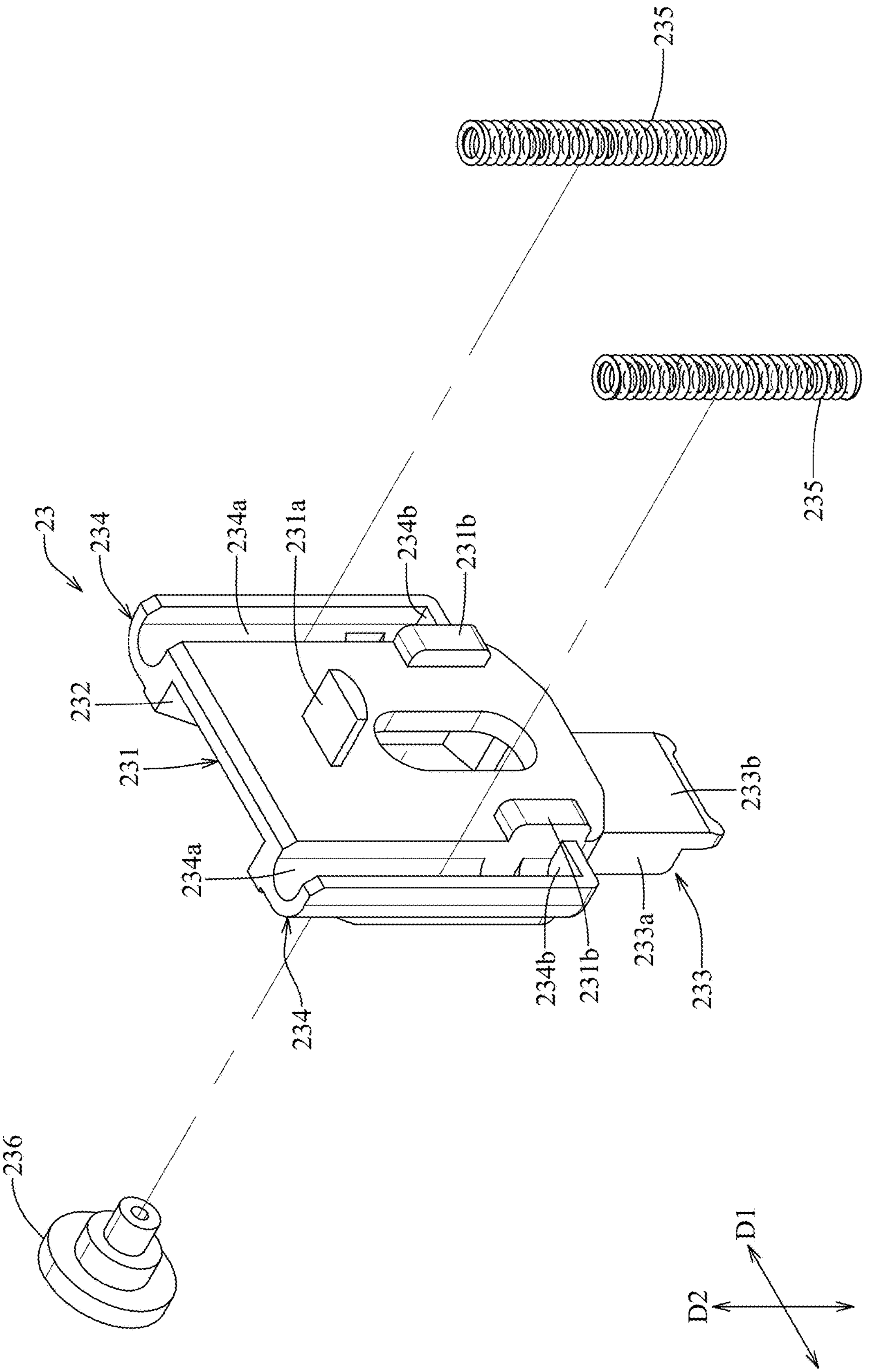
FIG. 9 is an exploded perspective view of a latch member of the second rail module.
Figure 10:
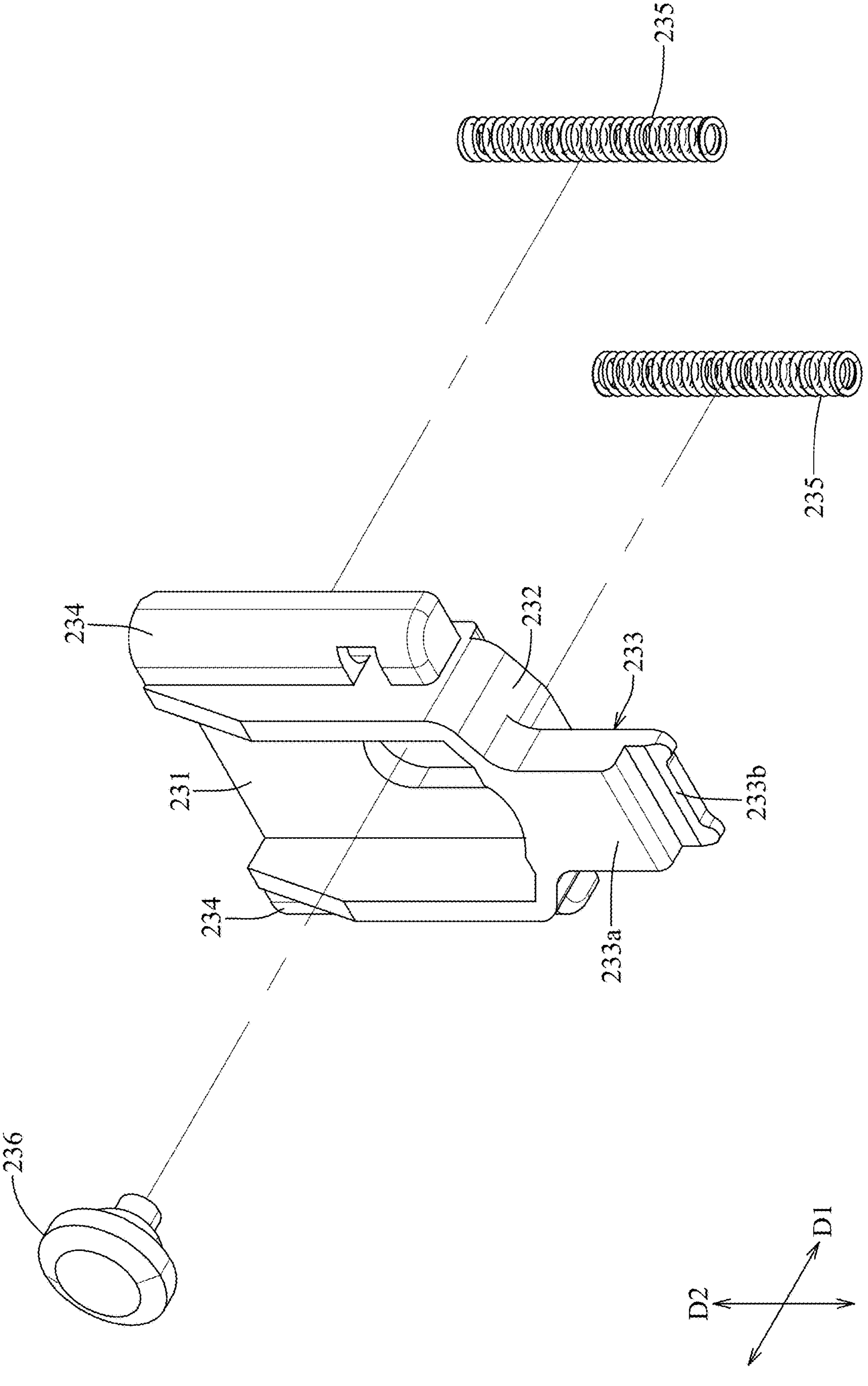
FIG. 10 is an exploded perspective view of the latch member, taken from another angle.
Figure 11:
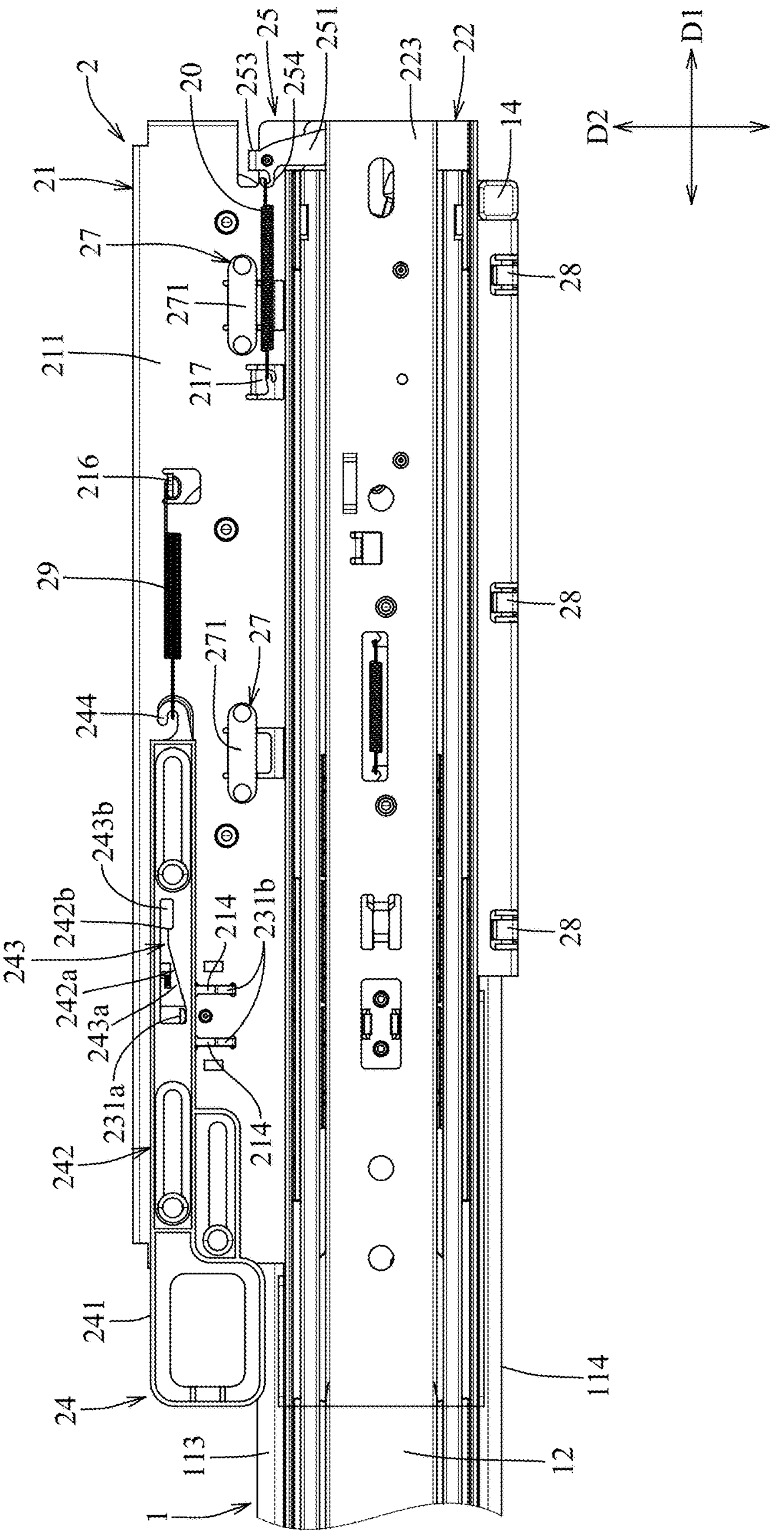
FIG. 11 is a fragmentary front view of the embodiment, illustrating an unlatch member of the second rail module in a latching state.

With reference to FIGS. 6 to 8, the slidable members 26 are disposed on the second plate surface 212 and in abutted engagement with the upper lateral wall 112 so as to facilitate smooth sliding movement of the second rail module 2 relative to the first support plate 11. Specifically, the slidable members 26 are rollers or the like, and the number of the slidable members 26 may vary and be at least two. Each of the two upper guiding members 27 is disposed on the second support plate 21 and straddles the upper extension wall 113 so as to permit the second support plate 21 to be movable along the upper extension wall 113. Specifically, each of the upper guiding members 27 has a mounting portion 271 disposed on the first plate surface 211, and a straddle portion 272 connected with the mounting portion 271 and extending through the second support plate 21 to abut against the corresponding abutted plate 218. The straddle portion 272 has an inverse U-shaped cross-section and straddles the upper extension wall 113. Each of the three lower guiding members 28 is disposed on the second support plate 21 and straddles the lower extension wall 114. With the upper guiding members 27 and the lower guiding members 28 diminishing the frictional force generated during sliding movement of the second rail module 2 relative to the first support plate 11, the second rail module 2 is smoothly slidable relative to the first support plate 11. It is noted that the number of the slidable members 26, the upper guiding members 27 and the lower guiding members 28 may vary and be at least two.

Figure 12:
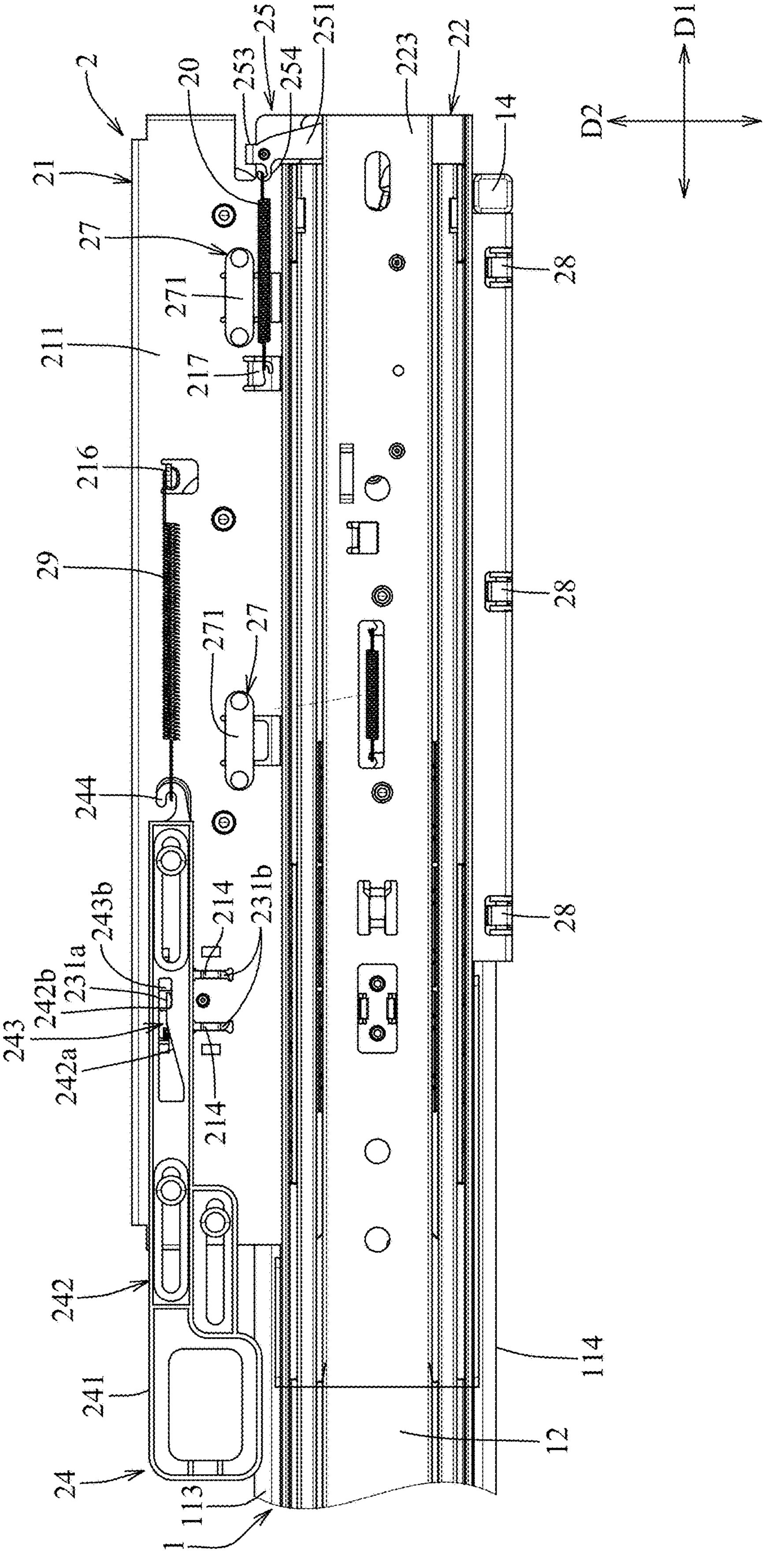
FIG. 12 is a fragmentary front view of the embodiment, illustrating the unlatch member in an unlatching state.
Figure 13:
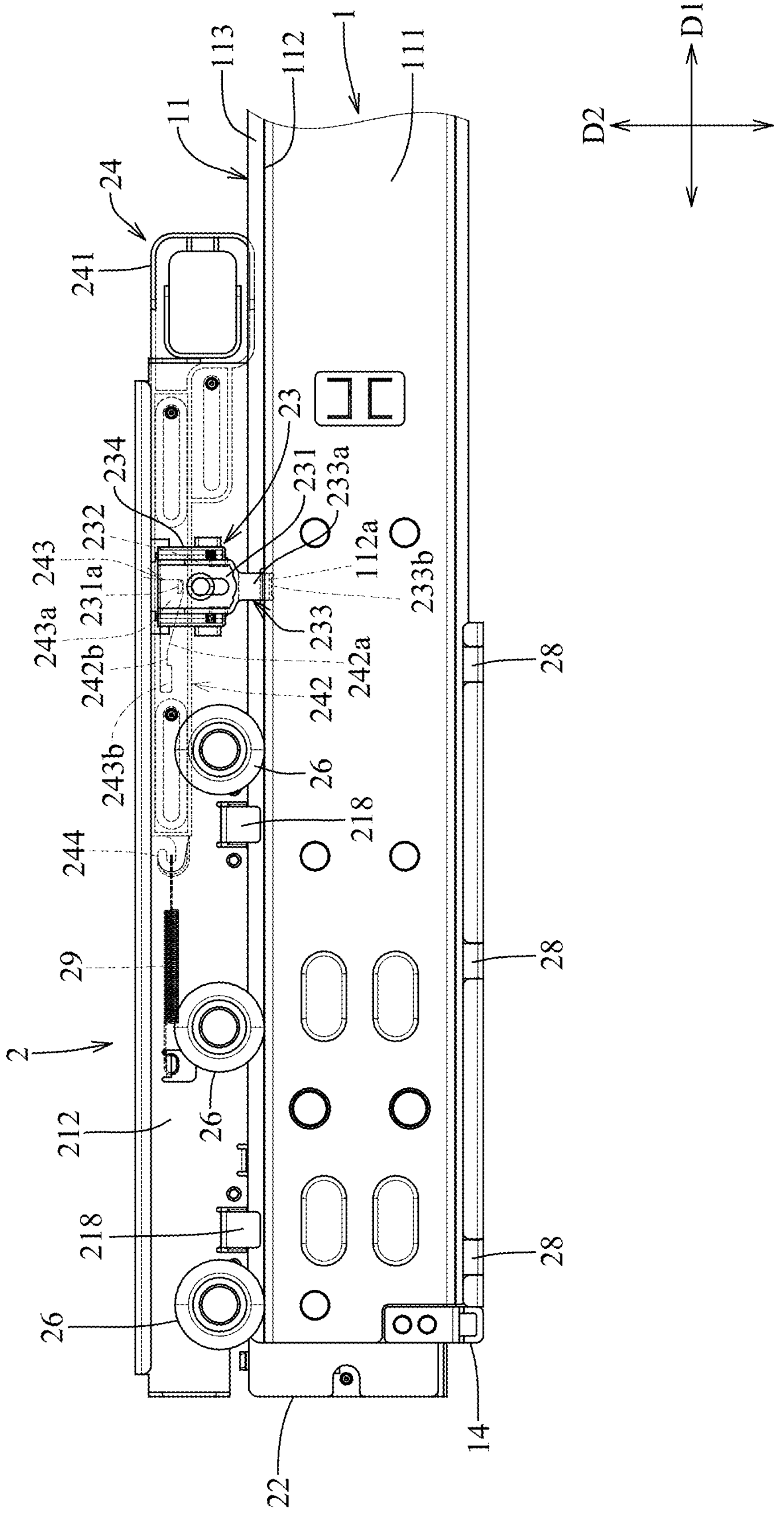
FIG. 13 is a fragmentary rear view of the embodiment, illustrating the unlatch member in the latching state.
Figure 14:
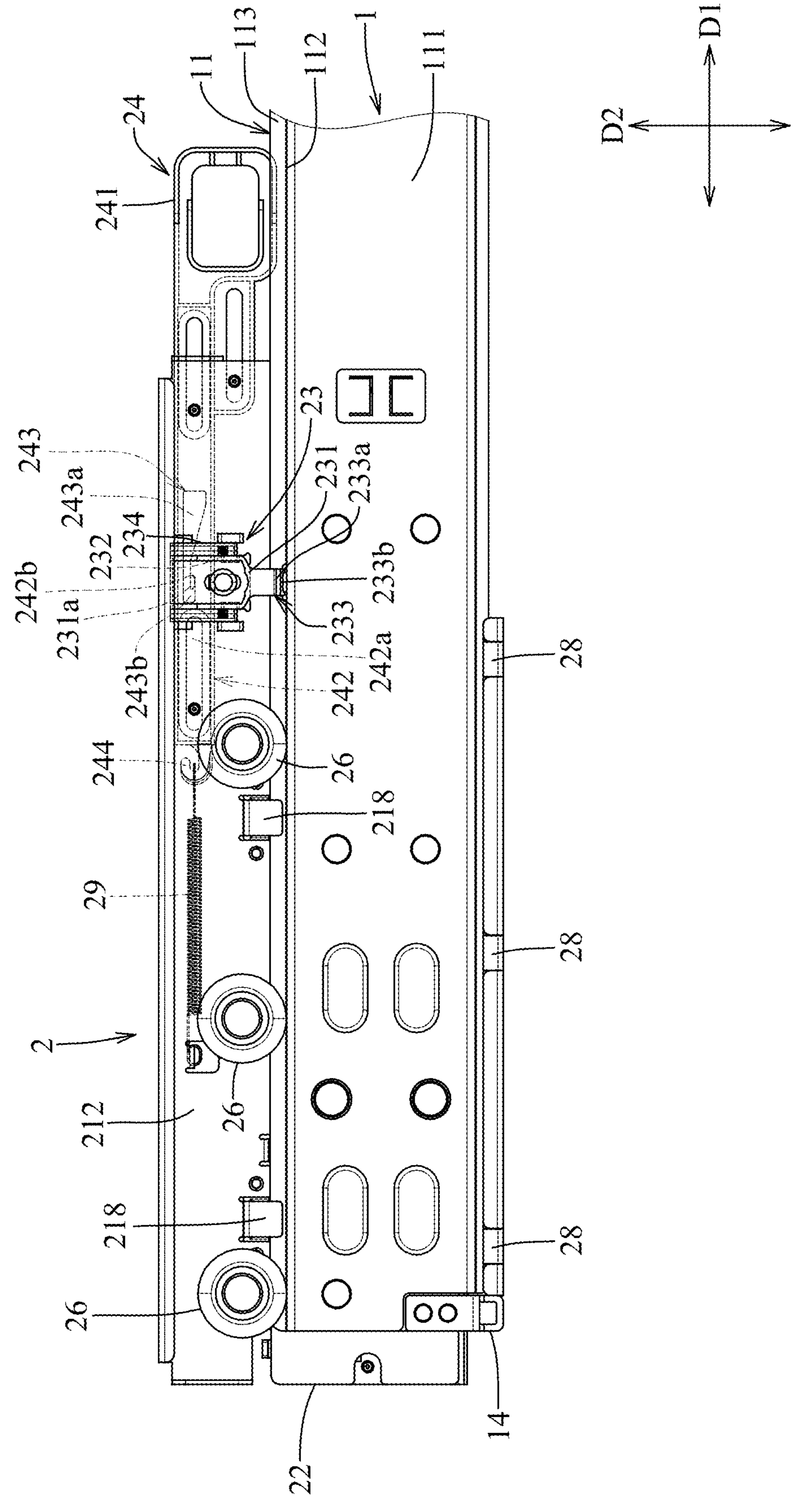
FIG. 14 is a fragmentary rear view of the embodiment, illustrating the unlatch member in the unlatching state.

With reference to FIGS. 11 to 14, the unlatch member 24 is operable to move in the horizontal direction (D1) to bring movement of the latch member 23 relative to the second support plate 21 between a latching position (see FIGS. 11 and 13) and an unlatching position (see FIGS. 12 and 14). In the latching position, the driven protrusion 231*a* of the latch member 23 is in abutting engagement with the sliding portion 113*a* and is located at a lower end of the moving slot 213 and a distal end of the inclined section 243*a* that is distal from the unlatching section 243*b* to be in abutting engagement with the moving portion 242, and the latch section 233*b* is inserted into the first lock hole 112*a* to prevent the movement of the second support plate 21 relative to the first support plate 11. The operating portion 241 is operable to move in the horizontal direction (D1) away from the second support plate 21 so as to bring the driven protrusion 231*a* to move upwardly along the inclined surface 242*a* and the moving slot 213 to reach the unlatching section 243*b* and to be retained by the retaining surface 242*b* in the unlatching position. In the unlatching position, the latch section 233*b* is disengaged from the first lock hole 112*a* so as to allow the movement of the second support plate 21 relative to the first support plate 11. At this stage, the first biasing member 29 is tensed, and the upright biasing members 235 (see FIG. 6) are compressed to bias the unlatch member 24 and the latch member 23 toward the latching position.

Figure 15:
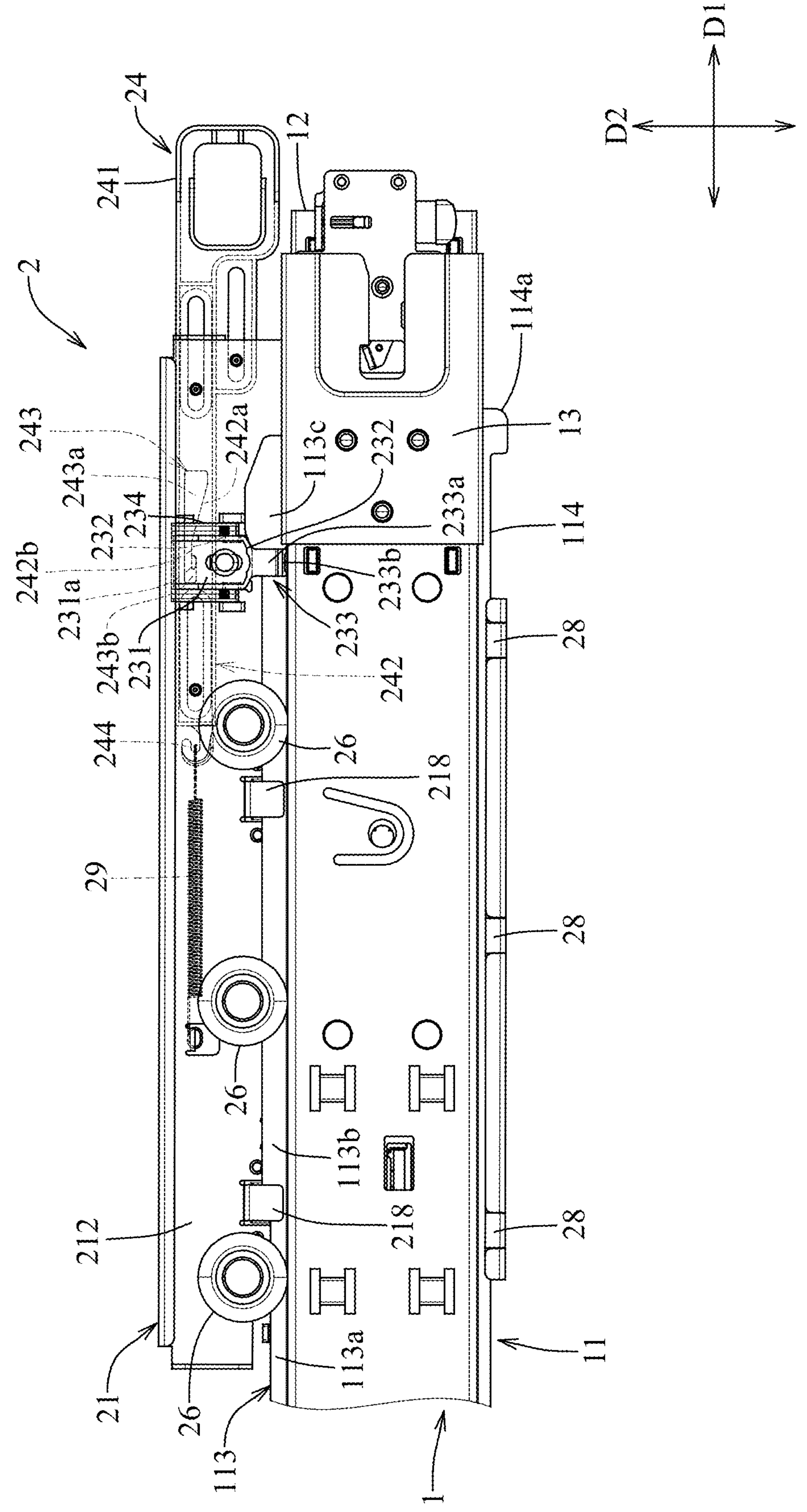
FIG. 15 is a fragmentary rear view of the embodiment, illustrating a state when the latch member abuts against a higher portion of an upper extension wall of the first support plate.
Figure 16:
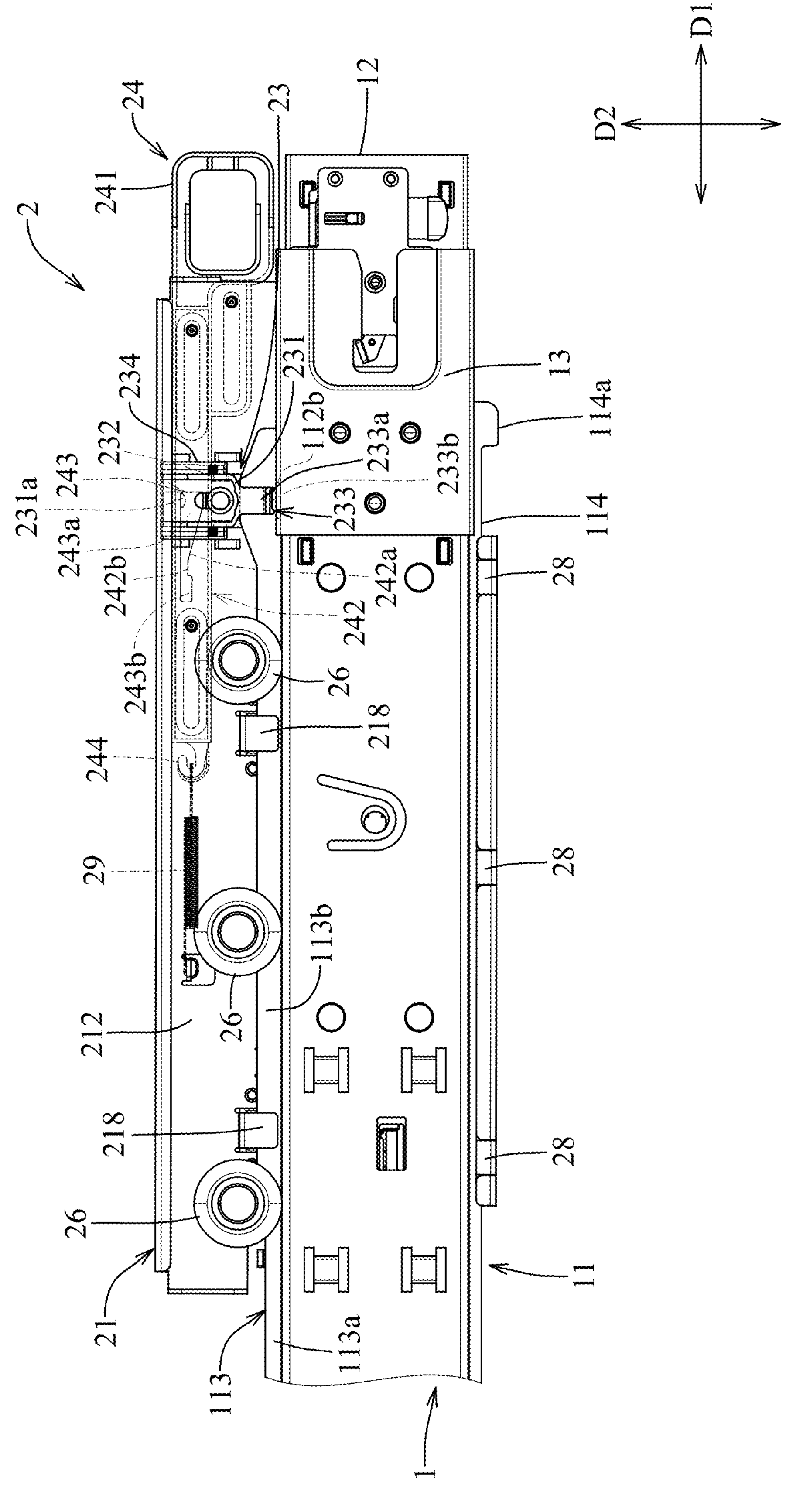
FIG. 16 is a fragmentary rear view of the embodiment, illustrating a state when the latch member is moved on the higher portion.
Figure 17:
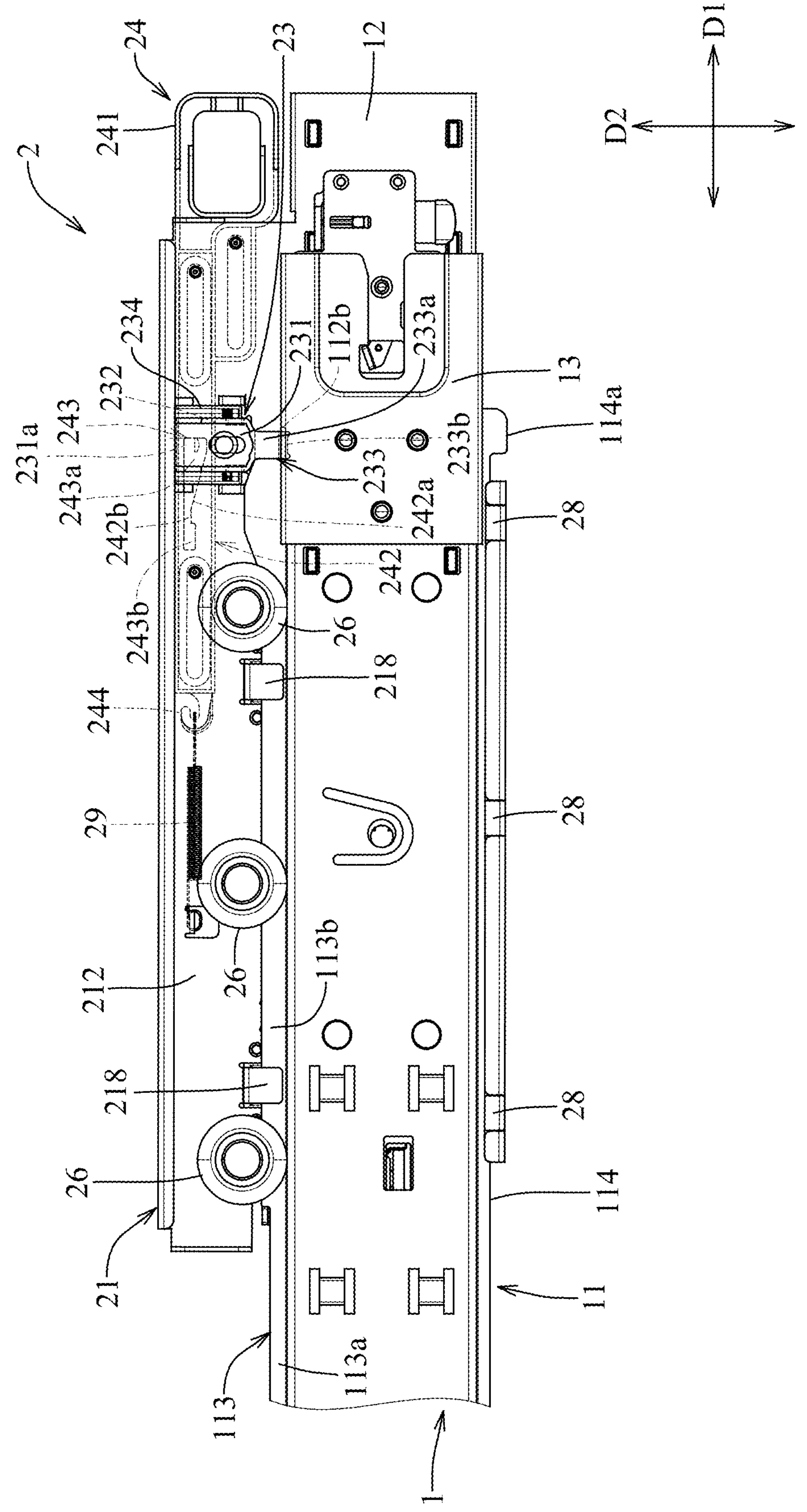
FIG. 17 is a fragmentary rear view of the embodiment, illustrating a state when the latch member is moved over the higher portion and is inserted into a second lock hole of the first support plate.

With reference to FIGS. 15 and 16, during the movement of the second support plate 21 toward the second end 111*b*, the surrounding wall portion 232 of the latch member 23 abuts against and is raised by the higher portion 113*c* to move the latch member 23 upwardly so as to bring the driven protrusion 231*a* to move upwardly and disengage from the retaining surface 242*b*. At this time, the unlatch member 24 is biased by the first biasing member 29 to move toward the second support plate 21 in the horizontal direction (D1) to return to the latching position. Meanwhile, the driven protrusion 231*a* of the latch member 23 is still at an upper end of the inclined section 243*a* of the unlatch slot 243, as shown in FIG. 16. Subsequently, with reference to FIGS. 5 and 17, when the surrounding wall portion 232 is moved over the higher portion 113*c*, the latch member 23 is biased downwardly by the upright biasing members 235 to bring the latch section 233*b* to be inserted into the second lock hole 112*b* so as to position the second support plate 21 relative to the first support plate 11, as shown in FIG. 17.

Figure 18:
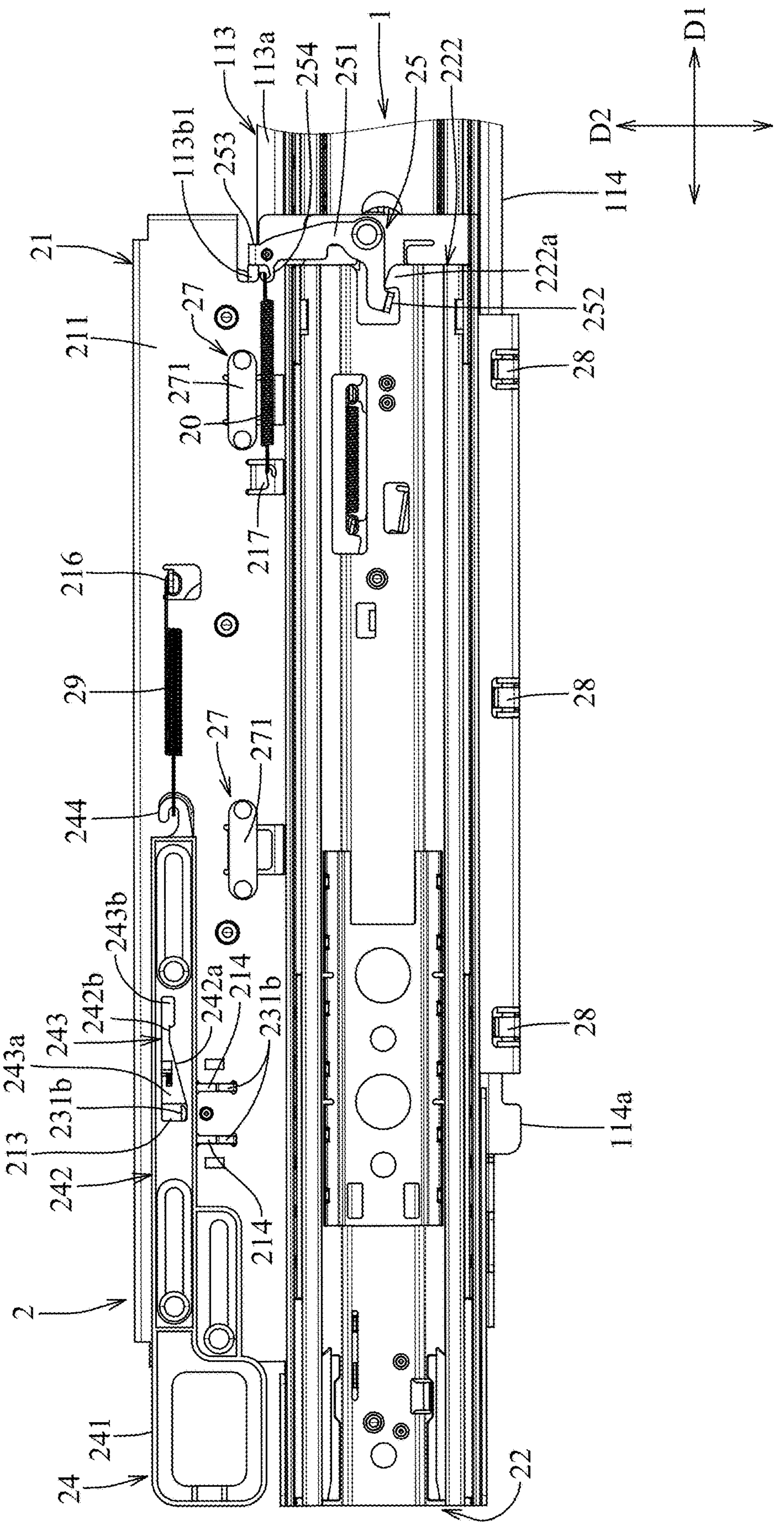
FIG. 18 is a fragmentary front view of the embodiment, illustrating a state when a releasably retaining member of the second rail module abuts against an abutting face of the upper extension wall.
Figure 19:
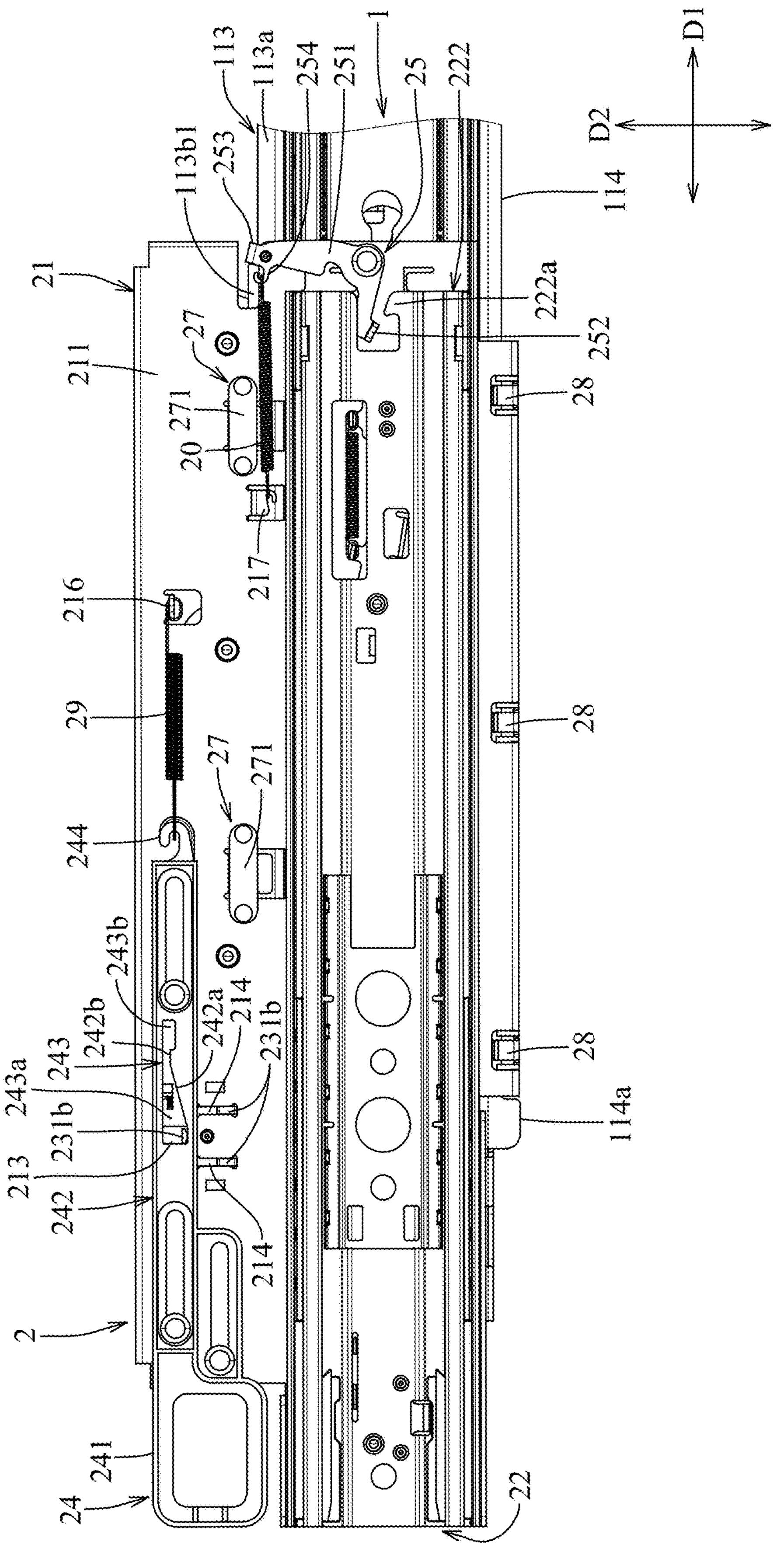
FIG. 19 is a fragmentary front view of the embodiment, illustrating a state when the releasably retaining member is turned by the abutting face to release engagement of a second outer rail from a second middle rail.

With reference to FIGS. 5, 18 and 19, moreover, during the movement of the second support plate 21 toward and approaching the second end 111*b*, the abutted portion 253 of the releasably retaining member 25 is brought to abut against the abutting face 113*b*1 of the first support plate 11 to turn the retaining portion 252 upward so as to release the engagement of the retaining portion 252 from the middle hook portion 222*a* to permit the second middle rail 222 to be moved out of the second outer rail 221. The second biasing member 20 can bias the retaining portion 252 of the releasably retaining member 25 to return to its original position to be engaged with the middle hook portion 222*a*.

As illustrated, with the latch member 23 being engageable in the first lock hole 112*a*, during the installation process for mounting a server rack on the first rail device 12, the second rail module 2 is prevented from movement relative to the first support plate 11, which enhances safety of a user during installation. Additionally, through the operation of the unlatch member 24 that brings the latch member 23 to be disengaged from the first lock hole 112*a*, the second support plate 21 is movable relative to the first support plate 11 to allow the second rail module 2 to be movable relative to the first rail module 1 in use.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A slide rail system, comprising:

a first rail module including a first support plate and a first rail device disposed on said first support plate, said first support plate having a first lock hole; and a second rail module including a second support plate movably disposed on said first support plate, a second rail device disposed on said second support plate, a latch member movably disposed on said second support plate and insertable into said first lock hole to restrict movement of said second support plate relative to said first support plate, and an unlatch member movably disposed on said second support plate, wherein said unlatch member is operable to bring movement of said latch member relative to said second support plate to disengage said latch member from said first lock hole so as to allow movement of said second support plate relative to said first support plate.

2. The slide rail system of claim 1, wherein said second support plate has a first plate surface on which said second rail device is disposed, a second plate surface opposite to said first plate surface, and a moving slot, said latch member including a flat wall portion which is movably disposed on said second plate surface, a surrounding wall portion which is formed on said flat wall portion and extends away from said second plate surface, a latch portion which is formed on said surrounding wall portion and insertable into said first lock hole, and a driven protrusion which is formed on said flat wall portion and extends through said moving slot to be in abutting engagement with said unlatch member.

3. The slide rail system of claim 2, wherein said first support plate has a base wall, an upper lateral wall and a lower lateral wall respectively formed on an upper side and a lower side of said base wall, said first lock hole being formed in said upper lateral wall, said latch member being movable relative to said second support plate in an up-down direction, said latch portion having an abutting section which is disposed above said upper lateral wall to abut against said upper lateral wall, and a latch section which extends downwardly from said abutting section to be inserted into said first lock hole.

4. The slide rail system of claim 3, wherein said unlatch member has an operating portion, a moving portion connected with said operating portion and movably disposed on said first plate surface in a horizontal direction, and an unlatch slot formed through said moving portion, said driven portion extending through said unlatch slot to be in abutting engagement with said moving portion, said unlatch slot having an inclined section and an unlatching section in communication with said inclined section, said inclined section having a width which is measured in the up-down direction and is gradually decreased toward said unlatching section, said unlatching section having a width which is measured in the up-down direction and is larger than the width of an adjacent end of said inclined section that is adjacent to said unlatching section, said moving portion having an inclined surface which borders said inclined section, and a retaining surface which is formed between said inclined section and said unlatching section, said unlatch member being operable and movable in the horizontal direction between a latching position and an unlatching position, wherein, in the latching position, said driven protrusion of said latch member is located at a lower end of said moving slot and a distal end of said inclined section that is distal from said unlatching section to be in abutting engagement with said moving portion, and said latch section is inserted into said first lock hole, said operating portion being operable to move in the horizontal direction away from said second support plate to bring said driven protrusion to move upwardly along said inclined surface and said moving slot to reach said unlatching section and to be retained by said retaining surface in the unlatching position, and, in the unlatching position, said latch section being disengaged from said first lock hole so as to allow the movement of said second support plate relative to the first support plate.

5. The slide rail system of claim 4, wherein said base wall has a first end and a second end opposite to said first end in the horizontal direction, said first support plate further having an upper extension wall extending upwardly from said upper lateral wall, said second support plate being movable along said upper extension wall, said upper extension wall having a sliding portion extending from said first end toward said second end, a raised portion extending from and connected with said sliding portion and having a height which is measured in the up-down direction and which is larger than a height of said sliding portion to define an abutting face therebetween, and a higher portion formed at an end of said raised portion adjacent to said second end.

6. The slide rail system of claim 5, wherein said upper lateral wall has a second lock hole formed between said second end and said higher portion such that, during the movement of said second support plate toward said second end, said latch member is moved upwardly when said surrounding wall portion abuts against and is raised by said higher portion, so as to bring said driven protrusion to move upwardly and be disengaged from said retaining surface, whereby said operating portion of said unlatch member is operable to move said unlatch member toward said second support plate in the horizontal direction to the latching position, and, when said surrounding wall portion is moved over said higher portion, said latch section of said latch member is inserted into said second lock hole so as to position said second support plate relative to said first support plate.

7. The slide rail system of claim 5, wherein said second rail module further includes a releasably retaining member which is disposed on said first plate surface of said second support plate, said releasably retaining member having a pivot portion which is pivotably connected with said first plate surface, a retaining portion and an abutted portion which extend from said pivot portion and which are angularly spaced apart from each other, said abutted portion extending through said second support plate, said second rail device having a second outer rail which is disposed on said first plate surface, and a second middle rail which is telescopically disposed on said second outer rail, said second middle rail having a middle hook portion which is engageable with said retaining portion, such that, during the movement of said second support plate relative to said first support plate, said abutted portion is brought to abut against said abutting face of said first support plate to turn said retaining portion upward so as to release the engagement of said retaining portion from said middle hook portion.

8. The slide rail system of claim 7, wherein said releasably retaining member has a spring holding portion formed adjacent to said abutted portion, said second support plate having a second spring hook formed on said first plate surface, said second rail module further including a second biasing member connected between said spring holding portion and said second spring hook to bias said retaining portion of said releasably retaining member to engage with said middle hook portion.

9. The slide rail system of claim 4, wherein said unlatch member has a spring holding portion connected with said moving portion, said second support plate having a first spring hook formed on said first plate surface, said second rail module further including a first biasing member connected between said spring holding portion and said first spring hook to bias said unlatch member toward the latching position.

* * * * *